(12) United States Patent
Stark et al.

(10) Patent No.: US 6,958,443 B2
(45) Date of Patent: Oct. 25, 2005

(54) LOW POWER THERMOELECTRIC GENERATOR

(75) Inventors: Ingo Stark, Halle (DE); Peter Zhou, Riverside, CA (US)

(73) Assignee: Applied Digital Solutions, Riverside, CA (US)

( * ) Notice: Subject to any disclaimer, the term of this patent is extended or adjusted under 35 U.S.C. 154(b) by 0 days.

(21) Appl. No.: 10/440,992

(22) Filed: May 19, 2003

(65) Prior Publication Data

US 2004/0231714 A1 Nov. 25, 2004

(51) Int. Cl.$^7$ .......................... H01L 35/16; H01L 35/18
(52) U.S. Cl. ...................... 136/238; 136/205; 136/211; 136/212; 136/224; 136/225; 136/240; 257/467; 257/470
(58) Field of Search ................................ 136/205, 211, 136/212, 224, 225, 238, 240; 257/467, 470

(56) References Cited

U.S. PATENT DOCUMENTS 3,900,603 A * 8/1975 Rittmayer et al. .......... 148/537
4,249,121 A * 2/1981 Dahlberg .................... 322/2 R
5,286,304 A * 2/1994 Macris et al. ............... 136/201

(Continued)

FOREIGN PATENT DOCUMENTS

CH 677421 A5 5/1991
DE 2124465 11/1972
DE 2457586 A1 6/1975

(Continued)

OTHER PUBLICATIONS

Chemical Abstract No. 128:122424, (1997).*
Chemical Abstract No. 137:117698, (2002).*
Chemical Abstract No. 138:279413, (2002).*
Chemical Abstract No. 141:31987, (2003).*

(Continued)

Primary Examiner—Alan Diamond
(74) Attorney, Agent, or Firm—Stetina Brunda Garred & Brucker

(57) ABSTRACT

Disclosed is a foil segment for a thermoelectric generator comprising a top plate disposed in spaced relation above a bottom plate. An array of the foil segments is perpendicularly disposed in side-by-side arrangement between and in thermal contact with the bottom and top plates. Each foil segment comprises a substrate having a thickness of about 7.5–50 microns, opposing front and back substrate surfaces and a series of spaced alternating n-type and p-type thermoelectric legs disposed in parallel arrangement on the front substrate surface. Each of the n-type and p-type legs is formed of a bismuth telluride-based thermoelectric material having a thickness of about 5–100 microns, a width of about 10–100 microns and a length of about 100–500 microns. The alternating n-type and p-type thermoelectric legs are electrically connected in series and thermally connected in parallel such that a temperature differential between the bottom and top plates results in the generation of power.

6 Claims, 2 Drawing Sheets

U.S. PATENT DOCUMENTS

| | | | |
|---|---|---|---|
| 5,712,448 A | | 1/1998 | Vandersande et al. |
| 5,769,943 A | | 6/1998 | Fleurial et al. |
| 5,883,563 A | * | 3/1999 | Horio et al. ............. 338/22 SD |
| 5,959,341 A | * | 9/1999 | Tsuno et al. ................ 257/467 |
| 6,046,398 A | * | 4/2000 | Foote et al. ................ 136/201 |
| 6,288,321 B1 | | 9/2001 | Fleurial et al. |
| 6,300,150 B1 | | 10/2001 | Venkatasubramanian |
| 6,388,185 B1 | | 5/2002 | Fleurial et al. |
| 6,458,319 B1 | | 10/2002 | Caillat et al. |
| 2003/0089391 A1 | * | 5/2003 | Fukudome et al. ......... 136/227 |

FOREIGN PATENT DOCUMENTS

| | | | |
|---|---|---|---|
| DE | 29723309.2 | | 9/1998 |
| EP | 0034538 A2 | | 8/1981 |
| EP | 0408572 B1 | | 6/1993 |
| JP | 7-7186 A | * | 1/1995 |
| JP | 10-51037 A | * | 2/1998 |
| JP | 2003-92432 A | * | 3/2003 |
| WO | WO 89/07836 | | 8/1989 |
| WO | WO 99/54941 A1 | * | 10/1999 |

OTHER PUBLICATIONS

Stolzer et al, "Preparation of Highly Effective

Kim et al, "Effects of a Reduction Treatment and Te Doping Properties of (Bi1–xSbx)2Te3 Fabricated by Mechanical Alloying," 16th International Conference on Thermoelectrics, pp. 127–130, (1997).*p–Bio.5Sb1.5Te3 and n–Bi2Te2.7Se0.3 films," 15th International Conference on Thermoelectrics, IEEE, pp. 445–449, (1996).*

Stark et al, "New micro thermoelectric devices based on bismuth telluride–type thin solid films," 18th International Conference on Thermoelectrics, IEEE, pp. 465–472, (2000).*

Yamashita et al, "Bismuth telluride compounds with high thermoelectric figures of merit," Journal of Applied Physics, vol. 93(1), pp. 368–374, (Jan. 1, 2003).*

PLA 68/1737, 6900274, Aug. 27, 1970.

* cited by examiner

LOW POWER THERMOELECTRIC GENERATOR

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

The present invention pertains generally to thermoelectric devices and, more particularly, to a self-sufficient, low power thermoelectric generator having a compact size and a relatively high voltage output which is specifically adapted to be compatible with microelectronic devices.

The increasing trend toward miniaturization of microelectronic devices necessitates the development of miniaturized power supplies. Batteries and solar cells are traditional power sources for such microelectronic devices. However, the power that is supplied by batteries dissipates over time requiring that the batteries be periodically replaced. Solar cells, although having an effectively unlimited useful life, may only provide a transient source of power as the sun or other light sources may not always be available.

Thermoelectric generators are self-sufficient energy sources that convert thermal energy into electrical energy under established physics principles. The Seebeck effect is a transport phenomenon underlying the generation of power from thermal energy utilizing solid state electrical components with no moving parts. The Seebeck effect utilizes a pair of dissimilar metals (n-type and p-type), called thermocouples, which are joined at one end. N-type and p-type respectively stand for the negative and positive types of charge carriers within the material. If the joined end of the thermocouple is heated while the unjoined end is kept cold, an electromotive force (emf) or voltage potential is generated across the unjoined end. Based on free electron theory of metals, the forces acting on the electrons at the junction of the two dissimilar metals tend to pull the electrons from the metal having a higher electron density toward the metal having a lower electron density. The metal that gains electrons acquires negative electrical potential while the metal that loses electrons acquires positive potential.

The temperature gradient across the thermocouple may be artificially applied or it may be natural, occurring as "waste heat" such as the heat that is constantly rejected by the human body. In a wristwatch, one side is exposed to air at ambient temperature while the opposite side is exposed to the higher temperature of the wearer's skin. Thus, a small temperature gradient is present across the thickness of the wristwatch. A thermoelectric generator may be incorporated into the wristwatch to take advantage of the waste heat and generate a supply of power sufficient to operate the wristwatch as a self contained unit. Advantageously, many microelectronic devices that are similar in size to a typical wristwatch require only a small amount of power and are therefore compatible for powering by thermoelectric generators.

The operating parameters of a thermoelectric generator may be mathematically characterized in several ways. For example, the voltage measured across unjoined ends of a thermocouple is directly proportional to the temperature difference across the two ends. When n-type thermoelectric legs and p-type thermoelectric legs that make up a thermocouple are electrically connected in series but thermally connected in parallel with a temperature differential $T_1$ and $T_2$ maintained thereacross, the open circuit voltage V under the Seebeck effect may be mathematically expressed by the following formula:

$$V = S(T_1 - T_2)$$

where S is the Seebeck coefficient expressed in microvolts per degree ($\mu V/K$).

The efficiency of thermoelectric generators may be characterized by a thermoelectric figure of merit (Z), traditionally defined by the following formula:

$$Z = S^2 \sigma / \kappa$$

where $\sigma$ and $\kappa$ are the electrical conductivity and thermal conductivity, respectively. The figure of merit Z, expressed in reciprocal K, represents the thermal and electrical properties of a thermoelectric material that may be utilized in a thermoelectric generator. One of the keys to improve the efficiency of thermoelectric generators lies in the development of highly effective thermoelectric films having low electrical resistance, high Seebeck coefficient and low thermal conductivity.

Another key in improving thermoelectric generators lies in increasing the integration density of the thermocouples. Often with waste heat sources, only a small temperature difference exists between the heat source and the heat sink. Because of this small temperature difference, a large number of thermocouples must be connected in series in order to generate a sufficient thermoelectric voltage. Consequently, the thermocouples must have extreme aspect ratios of length to width of the cross-section.

The prior art includes a number of devices that attempt to improve the efficiency and operating characteristics of thermoelectric generators. One prior art device includes a heat-conducting substrate disposed in thermal contact with a high-temperature region opposite a low-temperature region. Heat flows from the high-temperature region into the heat-conducting substrate and into a number of alternating n-type and p-type thermoelectric legs cut from crystal material. The n-type and p-type thermoelectric legs are electrically connected in series and thermally connected in parallel. The n-type and p-type thermoelectric legs are formed on the substrate in a two-dimensional checkerboard pattern. Because total voltage is the sum of the individual voltages across each n-type and p-type pair, and because each thermocouple of n-type and p-type thermoelectric legs may produce only a few millivolts for a given temperature differential, a very large area is required in order to encompass the checkerboard pattern of alternating n-type and p-type thermoelectric legs. Such a large area requirement prevents the miniaturizing of the thermoelectric generator.

Another prior art device provides a thermoelectric module having a gapless insulating eggcrate for providing insulated spaces for a number of n-type and p-type thermoelectric legs. The absence of gaps eliminates the possibility of interwall electrical shorts between the thermoelectric legs. The thermoelectric legs are electrically connected in series and thermally connected in parallel between hot and cold sides of the module. Electrical connections are comprised of a layer of aluminum over a layer of molybdenum. The surfaces are ground down to expose the eggcrate walls except in the areas where the thermoelectric legs are interconnected. Although the module of the reference overcomes the problems of electrical shorts between adjacent thermoelectric legs, the device of the reference requires numerous manufacturing steps and is therefore costly.

Other prior art devices attempting to miniaturize thermoelectric generators have increased the integration density of thermocouples by miniaturizing the individual monolithic structures of the thermocouples. Although such devices succeeded in reducing the cross section of these bulk material bismuth telluride thermocouples to a sufficiently small size, the extreme difficulty in handling and fabricating these bismuth telluride-type thermocouples from bulk material translates into extremely high production costs leading to a very high cost of the final product.

In view of the above-described shortcomings of conventional thermoelectric generators, there exists a need in the art for a thermoelectric generator that is compatible with the requirements of microelectronic devices. More specifically, there exists a need for a thermoelectric generator for producing low power that is of compact size, and that is specifically adapted for producing a high output voltage while being mass-producible at a relatively low cost.

SUMMARY OF THE INVENTION

The present invention specifically addresses and alleviates the above referenced deficiencies associated with thermoelectric generators. More particularly, the present invention is an improved foil segment for a self-sufficient, low power thermoelectric generator having a compact size and that is specifically adapted to be compatible with microelectronic devices.

The thermoelectric generator takes advantage of a thermal gradient to generate useful power according to the Seebeck effect. The thermoelectric generator is comprised of a bottom plate, a top plate, and an array of foil segments. The array of foil segments are interposed between the bottom plate and the top plate in side-by-side arrangement. Each of the foil segments is perpendicularly disposed between and in thermal contact with the bottom and top plates. A series of alternating n-type and p-type thermoelectric legs is disposed on a substrate of each one of the foil segments. The thermoelectric legs are generally fabricated from a bismuth telluride-type thermoelectric material. The top plate is disposed in spaced relation above the bottom plate.

The bottom and top plates may have a generally orthogonal configuration and may be fabricated from any rigid material such as ceramic material. The bottom plate and top plate are configured to provide thermal contact between a heat sink and a heat source such that a temperature gradient may be developed across the alternating n-type and p-type thermoelectric legs.

Each one of the foil segments has a front substrate surface and a back substrate surface opposing the front substrate surface. The foil segments are arranged such that the back substrate surface of a foil segment faces the front substrate surface of an adjacent foil segment. The spaced, alternating n-type and p-type thermoelectric legs are disposed in parallel arrangement to each other on the front substrate surface. Each of the n-type and p-type thermoelectric legs are formed of the thermoelectric material generally having a thickness in the range of from about 5 microns ($\mu$m) to about 100 $\mu$m, with a preferable thickness of about 7 $\mu$m. The front substrate surface may have a surface roughness that is smoother than that of the back substrate surface in order to enhance the repeatability of forming the n-type and p-type thermoelectric legs on the front substrate surface.

A p-type and n-type thermoelectric leg pair makes up a thermocouple of the thermoelectric generator. The width of the thermoelectric legs may be in the range of from about 10 $\mu$m to about 100 $\mu$m, the length thereof being in the range of from about 100 $\mu$m to about 500 $\mu$m. A preferred length of the n-type and p-type thermoelectric legs is about 500 $\mu$m. A preferred width of the n-type thermoelectric leg is about 60 $\mu$m while a preferred width of the p-type thermoelectric leg is about 40 $\mu$m. The geometry of the respective n-type and p-type thermoelectric legs may be adjusted to a certain extent depending on differences in electrical conductivities of each n-type and p-type thermoelectric leg.

Each one of the p-type thermoelectric legs is electrically connected to adjacent n-type thermoelectric legs at opposite ends of the p-type thermoelectric legs by a hot side metal bridge and a cold side metal bridge such that electrical current may flow through the thermoelectric legs from a bottom to a top of a p-type thermoelectric leg and from a top to a bottom of an n-type thermoelectric leg. The plurality of foil segments may preferably include a total of about 5000 thermocouples connected together and substantially evenly distributed on the array of foil segments and forming a thermocouple chain. Each of the thermocouples includes one n-type and one p-type thermoelectric leg. Thus, a thermoelectric generator having 5000 thermocouples will include 5000 n-type thermoelectric legs and 5000 p-type thermoelectric legs. The thermoelectric generator may preferably include about 120 foil segments with each of the respective ones of the foil segments including about 40 thermocouples although any number of foil segments may be included. A contact pad may be disposed at each of extreme ends of the thermocouple chain.

Each one of the hot side metal bridges and cold side metal bridges is configured to electrically connect an n-type thermoelectric leg to a p-type thermoelectric leg. Each one of the hot side and cold side metal bridges is also configured to act as a diffusion barrier in order to impede the diffusion of unwanted elements into the n-type and p-type thermoelectric legs which may be easily contaminated with foreign material. Additionally, each one of the hot side and cold side metal bridges is configured to impede the diffusion of unwanted elements out of the n-type and p-type thermoelectric legs. Finally, each one of the hot side and cold side metal bridges is configured to conduct heat into and out of the p-type and n-type thermoelectric legs. In this regard, the hot side and cold side metal bridges may be fabricated of a highly thermally conductive material such as gold-plated nickel.

The substrate may have a thickness in the range of from about 7.5 $\mu$m to about 50 $\mu$m, although the thickness of the substrate is preferably about 25 $\mu$m. Because of the desire to reduce the thermal heat flux through the substrate in order to increase the efficiency of energy conversion, it is desirable to decrease the thickness of the substrate upon which the thermoelectric legs are disposed. An electrically insulating material with a low thermal conductivity such as polyimide film may be utilized for the substrate. The thermoelectric film that makes up the n-type and p-type thermoelectric legs may be comprised of a semiconductor compound of the bismuth telluride ($Bi_2Te_3$) type. However, specific compositions of the semiconductor compound may be altered to enhance the thermoelectric performance of the n-type and p-type thermoelectric legs. Specifically, the composition of the n-type thermoelectric legs may include selenium (Se). The composition of the p-type thermoelectric legs may include antimony (Sb). Furthermore, the excess of tellurium (Te) in respective ones of the p-type and n-type thermoelectric legs may be altered in order to enhance the fabrication thereof.

Magnetron sputtering may be utilized for deposition of a relatively thick bismuth telluride-based thermoelectric film onto the thinner substrate at an optimal sputtering deposition rate of about 2.7 nanometers per second.

BRIEF DESCRIPTION OF THE DRAWINGS

These as well as other features of the present invention will become more apparent upon reference to the drawings wherein.

DETAILED DESCRIPTION OF THE INVENTION

Figure 1:
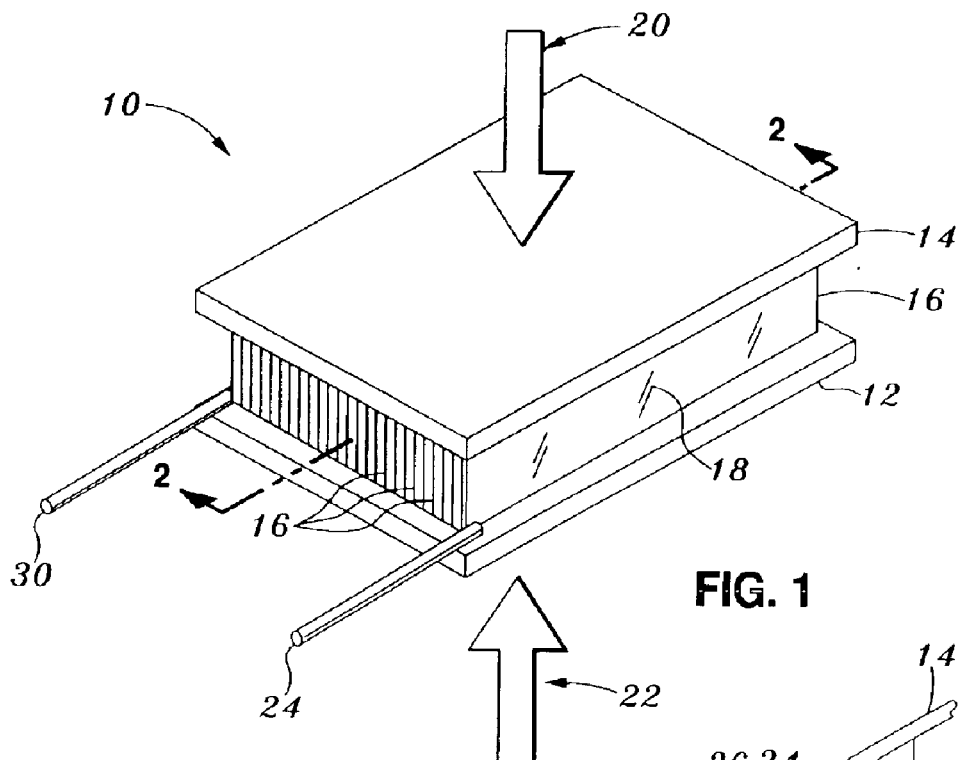
FIG. 1 is a perspective view of a thermoelectric generator illustrating the arrangement of a plurality of foil segments of the present invention.

Referring now to the drawings wherein the showings are for purposes of illustrating preferred embodiments of the present invention and not for purposes of limiting the same, FIG. 1 is a perspective view of the thermoelectric generator 10 within which a foil segment 16 of the present invention may be utilized. As mentioned above, the thermoelectric generator 10 takes advantage of a thermal gradient to generate useful power according to the Seebeck effect. The thermoelectric generator 10 is typically comprised of a bottom plate 12, a top plate 14, and an array of foil segments 16. The array of foil segments 16 are interposed between the bottom plate 12 and the top plate 14 in side-by-side arrangement, with each one of the foil segments 16 being perpendicularly disposed between and in thermal contact with the bottom and top plates 12, 14. A series of generally elongate, alternating n-type and p-type thermoelectric legs 32, 34 is disposed on a substrate 18 of each one of the foil segments 16. As will be discussed in more detail below, the thermoelectric legs 32, 34 are generally fabricated from a bismuth telluride-type thermoelectric material 44. As may be seen in FIG. 1, the top plate 14 is disposed in spaced relation above the bottom plate 12.

The bottom and top plates 12, 14 may have a generally orthogonal configuration of rectangular shape. However, it will be recognized that the bottom and top plates 12, 14, which generally define the overall size of the thermoelectric generator 10, may be of any shape or configuration. In this regard, although the generally rectangular shape of the bottom and top plates 12, 14 as seen in FIG. 1, may be easily adaptable for integrating the array of generally same-sized ones of the foil segments 16, the bottom plate 12 and the top plate 14 may optionally have a circular-like shape that may be adapted for use in a wearable microelectronic device, such as in a wrist-watch or a device generally shaped liked a wristwatch.

The bottom plate 12 and the top plate 14 may be fabricated from any material that is both substantially rigid and highly thermally conductive. In this regard, it is contemplated that ceramic material may be utilized to fabricate the bottom and top plates 12, 14. The bottom plate 12 and top plate 14 may be configured to substantially provide thermal contact between a heat sink 22 and a heat source 20, respectively, as can be seen in FIG. 1. The bottom and top plates 12, 14 may also be configured to provide a protective housing for the thermoelectric device 10 such that the foil segments 16 are protected from mechanical contact and chemical influences that may damage the foil segments 16.

Figure 2:
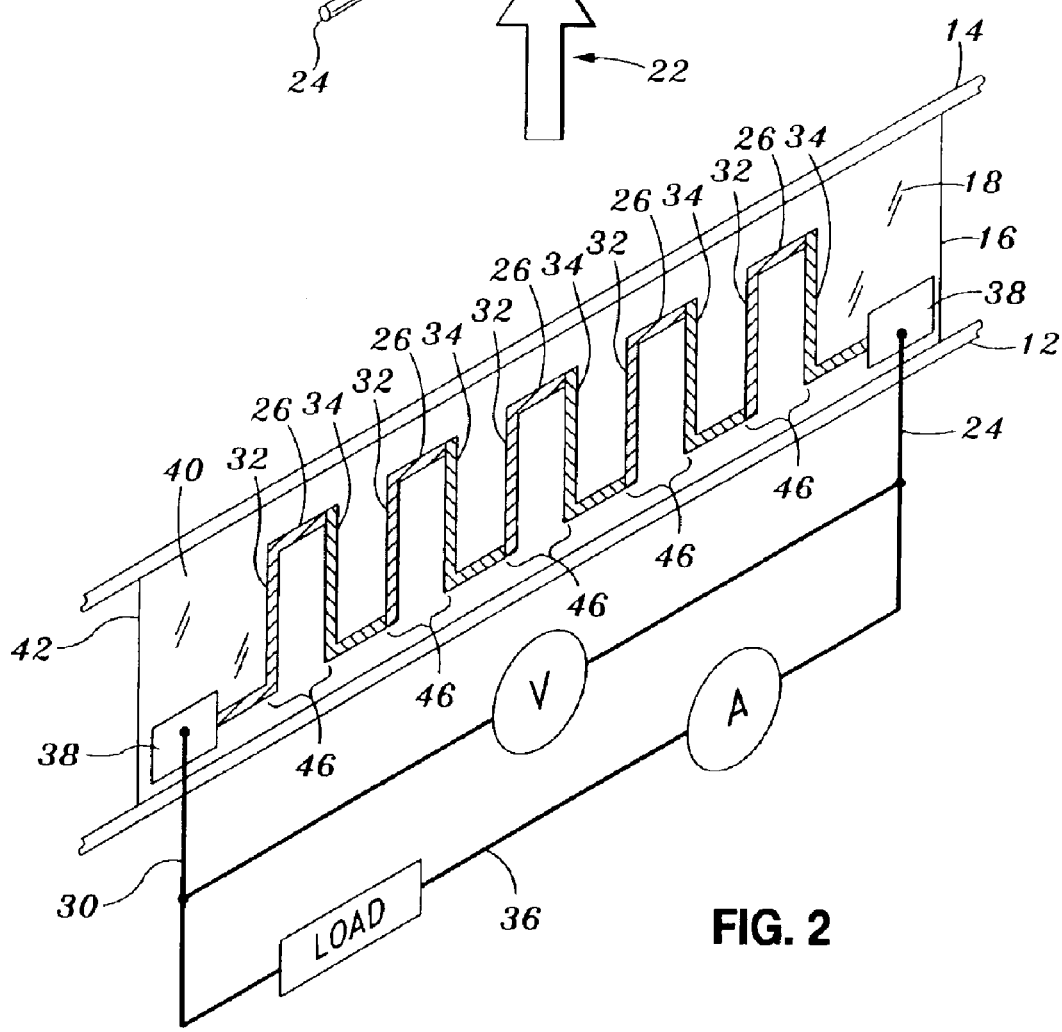
FIG. 2 is a cross-sectional side view of the thermoelectric generator taken along line 2—2 of FIG. 1 illustrating the arrangement of alternating n-type and p-type thermoelectric legs disposed on a substrate film of each of the foil segments.

Shown in FIG. 2 is a cross-sectional side view of the thermoelectric generator 10 taken along line 2—2 of FIG. 1 illustrating the arrangement of the alternating n-type and p-type thermoelectric legs 32, 34 disposed on a substrate 18 film of each of the foil segments 16. Each one of the foil segments 16 has a front substrate surface 40 and a back substrate surface 42 (not shown) opposing the front substrate surface 40. The foil segments 16 may be arranged such that the back substrate surface 42 of a foil segment 16 faces the front substrate surface 40 of an adjacent foil segment 16. The spaced, alternating n-type and p-type thermoelectric legs 32, 34 are disposed parallel to each other on the front substrate surface 40. Each of the n-type and p-type thermoelectric legs 32, 34 is formed of the thermoelectric material 44. Although the thermoelectric material 44 may have a thickness in the range of from about 5 microns ($\mu$m) to about 100 $\mu$m, a preferable thickness of the thermoelectric material 44 is about 7 $\mu$m.

Figure 3:
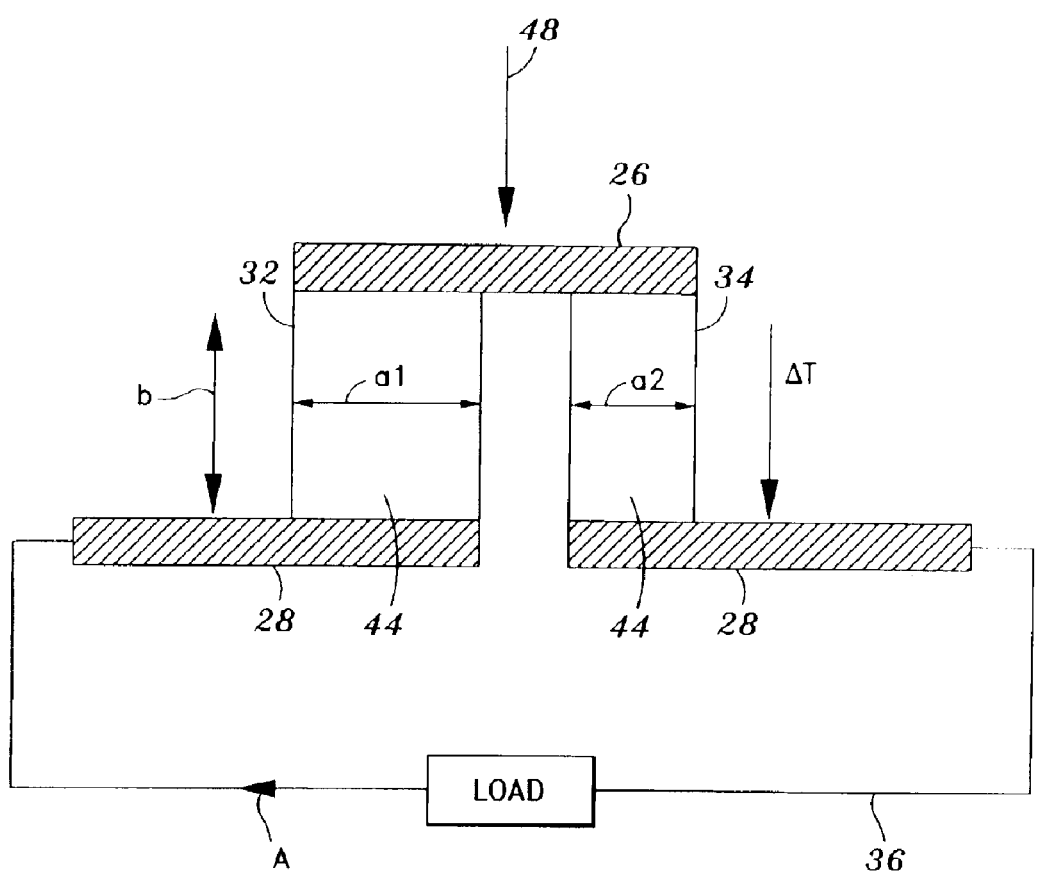
FIG. 3 is a schematic illustration of p-type and n-type thermoelectric leg pair that makes up a thermocouple of the thermoelectric generator.

Turning briefly now to FIG. 3, shown is a schematic representation of the n-type and p-type thermoelectric leg 32, 34 pair that makes up a thermocouple 46 of the thermoelectric generator 10. As can be seen in FIG. 3, the n-type and p-type thermoelectric legs 32, 34 have a respective width. The n-type thermoelectric leg width is denoted as $a_1$. The p-type thermoelectric leg 34 width is denoted as $a_2$. The thermoelectric leg 32, 34 length for both the n-type thermoelectric leg 32 and the p-type thermoelectric leg 34 is denoted as b. Although the n-type and p-type thermoelectric legs 32, 34 may have substantially equal lengths, it is contemplated that the thermoelectric generator 10 may be configured wherein the n-type and p-type thermoelectric legs 32, 34 are of differing lengths. Advantageously, the extreme aspect ratio of the length to the width allows the generation of relatively high thermoelectric voltages in the miniaturized thermoelectric generator 10.

The geometry of the respective ones of the n-type and p-type thermoelectric legs 32, 34 may be adjusted to a certain extent depending on differences in electrical conductivities of each one of the n-type and p-type thermoelectric legs 32, 34. The width of the thermoelectric legs 32, 34 may be in the range of from about 10 $\mu$m to about 100 $\mu$m. The lengths of the thermoelectric legs 32, 34 may be in the range of from about 100 $\mu$m to about 500 $\mu$m. A preferred length b of the n-type and p-type thermoelectric legs 32, 34 is about 500 $\mu$m. A preferred width $a_1$ of the n-type thermoelectric leg 32 is about 60 $\mu$m while a preferred width $a_2$ of the p-type thermoelectric leg 34 is about 40 $\mu$m. The thermoelectric properties of the p-type thermoelectric leg 34 are typically superior to those of the n-type thermoelectric leg 32. Therefore the width of the p-type thermoelectric legs 34 can be narrower than that of the n-type thermoelectric legs 32. Although the thermoelectric legs 32, 34 are shown in FIG. 2 as having an elongate configuration, it is contemplated that the thermoelectric legs 32, 34 may configured in numerous other configurations such as, for example, an L-shaped or S-shaped configuration.

The n-type and p-type thermoelectric legs 32, 34 are connected thermally in parallel and electrically in series. As illustrated in FIG. 1 and schematically in FIG. 2, each one of the p-type thermoelectric legs 34 is electrically connected to an adjacent one of the n-type thermoelectric legs 32 at opposite ends of the p-type thermoelectric legs 34 by a hot side metal bridge 26 and a cold side metal bridge 28. In this manner, electrical current may flow through the thermoelectric legs 32, 34 from a bottom to a top of a p-type thermoelectric leg 34 and from a top to a bottom of an n-type thermoelectric leg 32. Each alternating one of the thermoelectric legs 32, 34 is connected to an adjacent one of the thermoelectric legs 32, 34 of opposite conductivity type, forming a thermocouple 46.

In FIG. 3, the representative n-type thermoelectric leg 32 is connected at a respective upper end thereof to a respective upper end of the p-type thermoelectric leg 34. In FIG. 2, a plurality of n-type and p-type thermoelectric legs 32, 34 are connected at opposite ends thereof forming a plurality of thermocouples 46 leaving a free p-type thermoelectric leg 34 and a free n-type thermoelectric leg 32 end on respective extreme opposite end of the series. Whenever heat is applied by the heat source 20 through the top plate 14 at the hot side metal bridge 26, a temperature gradient, indicated by the symbol ΔT, is created with respect to the cold side metal bridge 28 of the thermocouple 46 at the bottom plate 12 and heat sink 22 such that a heat flux 48 flows through the thermoelectric generator 10. Current then flows through a load in the electrical circuit 36 in the direction indicated by the symbol A. The thermoelectric generator 10 may further comprise a first electrical lead 24 and a second electrical lead 30 respectively connected to opposite ends of the series of n-type and p-type thermoelectric legs 32, 34 at contact pads 38.

Each one of the hot side metal bridges 26 and cold side metal bridges 28 is configured to electrically connect an n-type thermoelectric leg 32 to a p-type thermoelectric leg 34. Each one of the hot side metal bridges 26 and cold side metal bridges 28 is also configured to act as a diffusion barrier in order to impede the diffusion of unwanted elements into the n-type and p-type thermoelectric legs 32, 34 which may be easily contaminated with foreign material. Furthermore, each one of the hot side metal bridges 26 and cold side metal bridges 28 is configured to impede the diffusion of unwanted elements out of the n-type and p-type thermoelectric legs 32, 34. Finally, each one of the hot side metal bridges 26 and cold side metal bridges 28 is configured to conduct heat into and out of the p-type and n-type thermoelectric legs 32, 34. In this regard, the hot side metal bridges 26 and cold side metal bridges 28 may be fabricated of a highly thermally conductive material such as gold-plated nickel.

In the illustration shown in FIG. 2, the first electrical lead 24 is connected to a free end of the n-type thermoelectric leg 32 while the second electrical lead 30 is connected to a free end of the p-type thermoelectric leg 34. However, for the thermoelectric generator 10 having an array of foil segments 16 disposed in side-by-side arrangement as shown in FIG. 1, the foil segments 16 are electrically connected in series such that a free one of the n-type thermoelectric legs 32 on an extreme end of the foil segment 16 is electrically connected to a free one of the p-type thermoelectric legs 34 of an adjacent one of the foil segments 16, and vice versa. In such a configuration, the first electrical lead 24 is connected to a free end of the n-type thermoelectric leg 32 of a forward-most foil segment 16 of the array while the second electrical lead 30 is connected to a free end of the p-type thermoelectric leg 34 of the aft-most foil segment 16 of the array.

It is contemplated that the plurality of foil segments 16 may preferably include a total of about 5000 thermocouples 46 substantially evenly distributed on the array of foil segments 16 although it is contemplated that the thermoelectric generator 10 may comprise any number of thermocouples 46 from about 1000 to about 20,000. The thermoelectric generator 10 may preferably include about 120 foil segments 16 with each of the respective ones of the foil segments 16 including about forty thermocouples 46. Alternatively, however, the thermoelectric generator 10 may include any number of foil segments 16 sufficient to integrate the total number of thermocouples 46 needed for producing the required power at the given operating temperatures. Assuming that all the thermocouples 46 are electrically connected in series, the total voltage output of the thermoelectric generator 10 is simply calculated as the sum of the individual voltages generated across each thermocouple 46.

Referring to FIG. 2, shown is the substrate 18 of the typical one of the foil segments 16 of the present invention. The substrate 18 has a thickness in the range of from about 7.5 μm to about 50 μm, although the thickness of the substrate 18 is preferably about 25 μm. Because of the desire to reduce the thermal heat flux 48 through the substrate 18 in order to increase the efficiency of energy conversion, it is desirable to decrease the thickness of the substrate 18 upon which the thermoelectric legs 32, 34 are disposed. Regarding the material that may comprise the substrate 18, an electrically insulating material may be utilized such that the adjacent ones of the thermoelectric legs 32, 34 disposed on the substrate 18 may be electrically insulated from one another.

The substrate 18 material may also have a low thermal conductivity and may be a polyimide film such as Kapton film made by DuPont. Due to its low thermal conductivity, polyimide film is an excellent substrate 18 for thermoelectric generators 10. In addition, polyimide film has a coefficient of thermal expansion that is within the same order of magnitude as that of the bismuth telluride-type material utilized in the thermoelectric legs 32, 34 in the room temperature range of about 70° F. Therefore, by utilizing polyimide film, the residual mechanical stresses that may occur at the substrate 18/thermoelectric material 44 interface may be minimized or eliminated. In this regard, the overall durability and useful life of the thermoelectric generator 10 may be enhanced.

The thermoelectric material 44 that makes up the n-type and p-type thermoelectric legs 32, 34 may be comprised of a semiconductor compound of the bismuth telluride ($Bi_2Te_3$) type, as was mentioned above. However, the specific compositions of the semiconductor compound may be altered to enhance the thermoelectric performance of the n-type and p-type thermoelectric leg 32, 34. In this regard, the semiconductor compound utilized in fabricating the p-type thermoelectric legs 32 may comprise a material having the formula:

$$(Bi_{0.15}Sb_{0.85})_2Te_3 \text{ plus 18 at. \% Te excess.}$$

although the excess may be in the range of from about 10 at. % Te excess to about 30 at. % Te excess. As a separate embodiment of the semiconductor compound, the thermoelectric generator 10 may include the plurality of n-type and p-type thermoelectric legs 32, 34 wherein each one of the p-type thermoelectric legs 34 is formed of the semiconductor compound having the formula $(Bi_{0.15}Sb_{0.85})_2Te_3$ plus about 10 at. % Te excess to about 30 at. % Te excess.

Although a number of microfabrication techniques may be utilized in depositing the thermoelectric material 44 onto the substrate 18, the method of sputtering, such as magnetron sputtering, may be utilized with the aid of high vacuum deposition equipment. Sputtering may be utilized for deposition of relatively thick bismuth telluride-based thermoelectric material 44 onto the thin substrates 18.

Advantageously, the rate of deposition of the thermoelectric material 44 onto the substrate 18 has been increased, resulting in a lower overall cost of the thermoelectric generator 10. In forming the thermoelectric material 44, the optimal sputtering deposition rate may be about 2.7 nanometers per second. However, because the sputtering deposition rate is dependent on the specific composition to be deposited as well as the intended thermoelectric material 44 properties, the sputtering deposition rate may be in the range of from about 2 nanometers per second to about 10 nanometers per second.

Additional modifications and improvements of the present invention may also be apparent to those of ordinary skill in the art. Thus, the particular combination of parts described and illustrated herein is intended to represent only certain embodiments of the present invention, and is not intended to serve as limitations of alternative devices within the spirit and scope of the invention.

What is claimed is:

1. A foil segment for a thermoelectric generator, the foil segment comprising:

a substrate having opposing front and back substrate surfaces; and a series of elongate alternating n-type and p-type thermoelectric legs disposed in spaced parallel arrangement on the front substrate surface, each of the n-type and p-type legs being formed of a $Bi_2Te_3$-type thermoelectric material having a thickness in the range of from about 5 microns to about 100 microns, each n-type and p-type thermoelectric leg having a width and a length, the width being in the range of from about 10 microns to about 100 microns, the length being in the range of from about 100 microns to about 500 microns; wherein:

each one of the p-type thermoelectric legs is electrically connected to an adjacent one of the n-type thermoelectric legs at opposite ends of the p-type thermoelectric legs such that the series of n-type and p-type thermoelectric legs are electrically connected in series and thermally connected in parallel;

the $Bi_2Te_3$-type thermoelectric material for the p-type thermoelectric legs being a semiconductor compound having the following formula:

$(Bi_{0.15}Sb_{0.85})_2Te_3$ plus about 10 at % Te excess to about 30 at % Te excess.

2. The foil segment of claim 1 wherein the semiconductor compound has about 18 at % Te excess.

3. The foil segment of claim 1 wherein each one of the p-type thermoelectric legs has a width of about 40 microns.

4. A foil segment for a thermoelectric generator, the foil segment including a plurality of n-type and p-type thermoelectric legs, each one of the p-type thermoelectric legs being formed of a semiconductor compound having the following formula:

$(Bi_{0.15}Sb_{0.85})_2Te_3$ plus about 10 at % Te excess to about 30 at % Te excess.

5. The foil segment of claim 4 wherein the semiconductor compound has about 18 at % Te excess.

6. A foil segment for a thermoelectric generator, the foil segment comprising:

a substrate having a thickness in the range of from about 7.5 microns to about 50 microns and including opposing front and back substrate surfaces, the substrate formed of an electrically insulating material having a low thermal conductivity; and a series of spaced alternating n-type and p-type thermoelectric legs disposed in parallel arrangement on each one of the front substrate surfaces, each of the n-type and p-type legs being formed of a $Bi_2Te_3$-type thermoelectric material and having a thickness in the range of from about 5 microns to about 100 microns, each n-type and p-type thermoelectric leg having a width and a length, the width being in the range of from about 10 microns to about 100 microns and the length being in the range of from about 100 microns to about 500 microns; wherein:

each one of the p-type thermoelectric legs is electrically connected to adjacent n-type thermoelectric legs at opposite ends of the p-type thermoelectric legs such that the series of n-type arid p-type thermoelectric legs are electrically connected in series and thermally connected in parallel;

each one of the p-type thermoelectric legs being formed of a semiconductor compound having the following formula:

$(Bi_{0.15}Sb_{0.85})_2Te_3$ plus about 18 at % Te excess.

* * * * *

UNITED STATES PATENT AND TRADEMARK OFFICE
CERTIFICATE OF CORRECTION

PATENT NO.         : 6,958,443 B2
APPLICATION NO.    : 10/440992
DATED              : October 25, 2005
INVENTOR(S)        : Ingo Stark and Peter Zhou It is certified that error appears in the above-identified patent and that said Letters Patent is hereby corrected as shown below:

Title page Item [56]

In the issued patent on Line 1 under the Other Publication section please delete "Stolzer et al, "Preparation of Highly Effective"" and insert therefore - - Stolzer et al, "Preparation of Highly Effective p-Bio.5Sb1.5Te3 and n-Bi2Te2.7Se0.3 films," 15th International Conference on Thermoelectrics, IEEE, pp.445-449, (1996).*- -

In the issued patent on Line 5 under Other Publication after (1997) please delete "p-Bio.5Sb1.5Te3 and n-Bi2Te2.7Se0.3 films," 15th International Conference on Thermoelectrics, IEEE, pp. 445-449, (1996).*

Signed and Sealed this

First Day of August, 2006

JON W. DUDAS
*Director of the United States Patent and Trademark Office*